(12) United States Patent
Beck

(10) Patent No.: US 11,774,522 B2
(45) Date of Patent: *Oct. 3, 2023

(54) QUANTUM ARCHITECTURE BIASING SCHEME

(71) Applicant: International Business Machines Corporation, Armonk, NY (US)

(72) Inventor: Matthew Beck, Danbury, CT (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 18/046,994

(22) Filed: Oct. 17, 2022

(65) Prior Publication Data

US 2023/0068621 A1 Mar. 2, 2023

Related U.S. Application Data

(63) Continuation of application No. 17/005,182, filed on Aug. 27, 2020, now Pat. No. 11,536,780.

(51) Int. Cl.
*G01R 33/035* (2006.01)
*G06N 10/00* (2022.01)
(Continued)

(52) U.S. Cl.
CPC ......... *G01R 33/0358* (2013.01); *G06N 10/00* (2019.01); *G06N 10/40* (2022.01);
(Continued)

(58) Field of Classification Search
CPC .... G01R 33/0358; G06N 10/00; G06N 10/40; H01L 39/223; H03F 19/00; H03K 5/0006; H03K 17/92; H03K 3/38; H10N 60/12
(Continued)

(56) References Cited

U.S. PATENT DOCUMENTS 6,483,339 B1 11/2002 Durand et al.
7,365,663 B2 4/2008 Rylov et al.
(Continued)

FOREIGN PATENT DOCUMENTS

EP 0 922 333 A1 6/1999
GB 2570989 A 8/2019
(Continued)

OTHER PUBLICATIONS

Volkmann et al., "Implementation of Energy Efficient Single Flux Quantum (eSFQ) Digital Circuits with sub-aJ/bit Operation", Department of Electrical and Electronic Engineering, Stellenbosch University, Private Bag X1, 7602, Stellenbosch, South Africa, 2012, 28 pages.
(Continued)

*Primary Examiner* — Arnold M Kinkead
(74) *Attorney, Agent, or Firm* — Amin, Turocy & Watson, LLP

(57) ABSTRACT

A radio-frequency (RF) to direct current (DC) converter is provided. When a DC electrical current is applied via a DC input port of the converter, the DC electrical current is shunted to ground through a Josephson junction (JJ) of the converter and substantially no DC electrical current flows through a resistor of the converter, and when an RF electrical current is applied via an RF input port of the converter, output trains of SFQ current pulses from a DC to SFQ converter of the RF-to-DC converter with pulse-to-pulse spacing inversely proportional to the RF electrical current frequency cause the JJ to switch at a rate commensurate with an RF frequency of the RF electrical current to generate a steady state voltage across the JJ linearly dependent on the RF frequency.

20 Claims, 8 Drawing Sheets

(51) Int. Cl.
  *H03F 19/00* (2006.01)
  *H03K 3/38* (2006.01)
  *H03K 17/92* (2006.01)
  *H03K 5/00* (2006.01)
  *G06N 10/40* (2022.01)
  *H10N 60/12* (2023.01)

(52) U.S. Cl.
  CPC .............. *H03F 19/00* (2013.01); *H03K 3/38* (2013.01); *H03K 5/00006* (2013.01); *H03K 17/92* (2013.01); *H10N 60/12* (2023.02)

(58) Field of Classification Search
  USPC ......... 326/3, 1, 7, 4; 327/186; 505/170, 589; 29/829; 427/62; 977/3
  See application file for complete search history.

(56) References Cited

U.S. PATENT DOCUMENTS

| | | | |
|---|---|---|---|
| 8,571,614 | B1 | 10/2013 | Mukhanov et al. |
| 9,174,840 | B2 | 11/2015 | Herr et al. |
| 10,411,713 | B2 | 9/2019 | Harms et al. |
| 10,488,469 | B2 | 11/2019 | Martinis |
| 11,536,780 | B2 * | 12/2022 | Beck ................. G06N 10/00 |
| 2003/0039138 | A1 | 2/2003 | Herr |

FOREIGN PATENT DOCUMENTS

| | | |
|---|---|---|
| JP | 2004-096261 A | 3/2004 |
| JP | 2010-226581 A | 10/2010 |
| WO | 98/08307 A1 | 2/1998 |

OTHER PUBLICATIONS

Romanus et al., "Yield Optimization of a RSFQ Voltage Doubler", Journal of Low Temperature Physics, Plenum Press, New York, US, vol. 106, No. 3, Feb. 1, 1997, pp. 521-526.

Ortlepp et al., "Superconductor-to-Semiconductor Interface Circuit for High Data Rates", IEEE Transactions On Applied Superconductivity, IEEE, USA, vol. 19, No. 1, Feb. 1, 2009, pp. 28-34.

Johnson et al., "A Scalable Control System for a Superconducting Adiabatic Quantum Optimization Processor", Superconductor Science and Technology, vol. 23, No. 6, 2010, 14 pages.

International Search Report and Written Opinion received for PCT Application Serial No. PCT/EP2021/071897 dated Jan. 10, 2022, 17 pages.

Non-Final Office Action received for U.S. Appl. No. 17/005,182 dated Jul. 7, 2022, 26 pages.

U.S. Appl. No. 17/005,182, filed Aug. 27, 2020.

* cited by examiner

QUANTUM ARCHITECTURE BIASING SCHEME

BACKGROUND

The currently claimed embodiments of the present invention relate to quantum computation, and more specifically, to a radio-frequency (RF) to direct current (DC) converter and bipolar quantized supercurrent generator (QSG) and quantum mechanical systems using the same.

The application of fast flux bias pulses has traditionally been accomplished by room temperature giga samples per second (GS/s) digital-to-analog converters (DACs) driving current into temperature T=4K resistors with the precision of the pulse amplitude set by a number of DAC bits and the Johnson noise of the bias resistor. However, this method suffers from large pulse shape distortion as the current pulse must traverse multiple temperature stages and filtering before arriving at the intended device (device under test—DUT). Additionally, to achieve precise pulse heights, a voltage DAC with a relatively large count is required. Furthermore, the wiring required to bias a plurality n of devices scales linearly with the number n of the plurality of devices. Therefore, it is desirable to provide a new way or system to generate fast current pulses that can either be applied directly to the device (DUT) or coupled as a flux via a pair of mutual inductors.

In addition, the application of static flux bias to superconducting circuitry has predominantly been performed via the application of a voltage to a cold resistor (e.g., at a temperature T of about 4K) which then drives current to a primary inductance loop mutually coupled to a device (DUT). The scaling of this approach in terms of the room temperature wiring and voltage source overhead is linear in the number of devices (DUTs) one wishes to flux bias. The heat load and physical space required to accommodate hundreds if not thousands of physical devices (e.g., qubits) required to demonstrate quantum advantage via implementation of computing paradigms such as the surface code is untenable. Therefore, it is also desirable to provide a new way or system to generate bi-polar flux bias current such that the scaling in number of devices to room temperature control lines is improved while achieving minimal to zero dynamic heat load at any stage of the cryostat.

SUMMARY

An aspect of the present invention is to provide a radio-frequency (RF) to direct current (DC) converter including a direct electrical current (DC) input port; a radiofrequency (RF) input port; and a direct electrical current (DC) to single flux quantum (SFQ) converter connected to the RF input port, the DC to SFQ converter being configured to convert RF current to SFQ current pulses. The converter further includes a Josephson junction (JJ) connected to both the DC input port via a first induction line and to the DC to SFQ converter via a second induction line and to ground; and a resistor connected to the Josephson junction and to the DC input port via a third induction line. In operation, when a DC electrical current is applied via the DC input port, the DC electrical current is shunted to ground through the JJ and substantially no DC electrical current flows through the resistor, and when an RF electrical current is applied via the RF input port, output trains of SFQ current pulses from the DC to SFQ converter with pulse-to-pulse spacing inversely proportional to the RF electrical current frequency cause the Josephson junction (JJ) to switch at a rate commensurate with an RF frequency of the RF electrical current to generate a steady state voltage across the Josephson junction (JJ) linearly dependent on the RF frequency such that an electrical current flowing through the resistor is directly dependent on the RF frequency of the RF electrical current.

In an embodiment, the converter further includes a plurality of Josephson junctions connected to both the DC input port via the first induction line and to the RF input port via the DC to SFQ converter through the second induction line and to ground. The plurality of Josephson junctions are configured to switch, when the RF electrical current is applied via the RF input port, at a rate commensurate the RF frequency of the RF electrical current to generate a steady state voltage across the plurality of Josephson junctions (JJ) linearly dependent on the RF frequency such that the electrical current flowing through the resistor is directly dependent on the RF frequency of the RF electrical current.

In an embodiment, the steady state voltage (V) across the Josephson junction (JJ) is proportional to the RF frequency ($f_{c1k}$) according to the following equation: $V=\Phi_0 \times f_{c1k}$, where $\Phi_0$ is a superconducting magnetic flux quantum.

A further aspect of the present invention is to provide a quantum mechanical system including the above radio-frequency (RF) to direct current (DC) converter. In an embodiment, the quantum mechanical system further includes at least one quantum mechanical device connected to the resistor. In an embodiment, the one or more devices includes, for example, a qubit, a superconducting quantum interference device, or a non-quantum mechanical circuit.

In an embodiment, the quantum mechanical system further includes a rapid single flux quantum (RSFQ) pulse doubler having an input port and an output port. The output port of the RSFQ pulse doubler is connected to an input port of the DC to SFQ converter, the RSFQ pulse doubler being configured to generate SFQ pulse current input through the input port of the DC to SFQ converter.

In an embodiment, the RSFQ pulse doubler is configured to generate a plurality of current pulses at double a rate of applied SFQ pulses at the output port of the RSFQ pulse doubler from a single radiofrequency current pulse input at the input port of RSFQ pulse doubler so as to generate a larger voltage across the converter.

In an embodiment, the quantum mechanical system further includes m stages of the rapid single flux quantum (RSFQ) pulse doubler connected in series. The m stages of the RSFQ pulse doubler are configured to generate the RF electrical current (I) that is given by the following formula: $I=2^m \times \Phi_0 \times f_{c1k}/R$, where $\Phi_0$ is a superconducting magnetic flux quantum, $f_{c1k}$ is the RF frequency of the RF electrical current, and R is a resistance value of the resistor.

In an embodiment, the quantum mechanical system includes a plurality of radio-frequency (RF) to direct current (DC) converters; and a plurality of quantum mechanical devices, each of the plurality of quantum mechanical devices being connected to a corresponding one of the plurality of RF to DC converters. The plurality of RF to DC converters are addressable so that the SFQ pulses produced from the RF electrical current are routed to a desired converter in the plurality of RF to DC converters.

In an embodiment, the quantum mechanical system further includes an input port configured to receive the direct electrical current (DC) and the radiofrequency (RF) electrical current; and a plurality of address lines, each address line having at least one demultiplexer (DEMUX) and a demultiplexer (DEMUX) in a first address line is connected to the input port. Each converter in the plurality of radio-frequency (RF) to direct current (DC) converters is connected to a corresponding one of the least one demultiplexer (DE-MUX).

In an embodiment, the demultiplexer (DEMUX) in the first address line is connected to two demultiplexers (DE-MUX) in a second address line and each of the two demultiplexers is connected to at least two radio-frequency (RF) to direct current (DC) converters.

Another aspect of the present invention is to provide a bipolar quantized supercurrent generator (QSG) including a first input port configured to receive at least one increment single flux quantum pulses and a second input port configured to receive at least one decrement single flux quantum pulses. The QSG further includes a first Josephson junction (JJ) connected to the first input port and a second Josephson junction (JJ) connected to the second input port, the first and second Josephson junctions being further connected to ground; and an inductor ($L_q$) connected to the first Josephson junction and to the second Josephson junction. The inductor ($L_q$) and the first and second Josephson junctions (JJs) form a superconducting quantum interference device (SQUID) loop. In operation, an electrical current circulating in the storage SQUID loop formed by the first Josephson junction, the second Josephson junction and the inductor ($L_q$) increases or decreases in increments based on the at least one increment single flux quantum pulses input through the first input port or the at least one decrement single flux quantum pulses input through the second input port, respectively.

In an embodiment, the electrical current circulating in the storage SQUID loop increases or decreases by electrical current increments $\Delta I$ given by the following equation: $\Delta I = \Phi_0/L_q$, where $\Phi_0$ is a superconducting magnetic flux quantum and $L_q$ is an inductance value of the inductor ($L_q$).

In an embodiment, the QSG further includes a third input port connected to the first Josephson junction (JJ), the second Josephson junction (JJ) and the inductor (Lq), the third input port being configured to input a bias direct electrical current (DC) to the storage loop to electrically bias the first and second Josephson junctions so that the first and second Josephson junctions produce pulses when pulses are applied to their respective inputs.

In an embodiment, a screening parameter $\beta_L$ of the SQUID loop is dependent on a critical electrical current I of the first and second Josephson junctions in the SQUID loop and the inductance value of the inductor connecting the first and second Josephson junctions.

In an embodiment, the QSG further includes a third Josephson junction (JJ) connected to the first Josephson junction (JJ) and the first input port via a first induction line; and a fourth Josephson junction (JJ) connected to the second Josephson junction (JJ) and the second input port via a second induction line. The first Josephson junction (JJ) and the third Josephson junction (JJ) form a first Josephson transmission line (JTL) and the second Josephson junction (JJ) and the fourth Josephson junction (JJ) form a second Josephson transmission line (JTL).

Yet another aspect of the present invention is to provide a quantum mechanical system comprising the above QSG. In an embodiment, the quantum mechanical system further includes a plurality of bipolar quantized supercurrent generators (QSGs); and a plurality of quantum mechanical devices, each of the plurality of quantum mechanical devices being inductively coupled to a corresponding one of the plurality of QSGs. The plurality of QSGs are addressable so that input SFQ pulses are routed to a desired QSG in the plurality of QSGs.

In an embodiment, the quantum mechanical system further includes an input port configured to receive a direct electrical current (DC) and a single flux quantum (SFQ) radiofrequency current; and a plurality of address lines, each address line having at least one demultiplexer (DEMUX) a demultiplexer (DEMUX) in a first address line is connected to the input port. Each QSG is connected to a corresponding one of the least one demultiplexer (DEMUX).

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Figure 1:
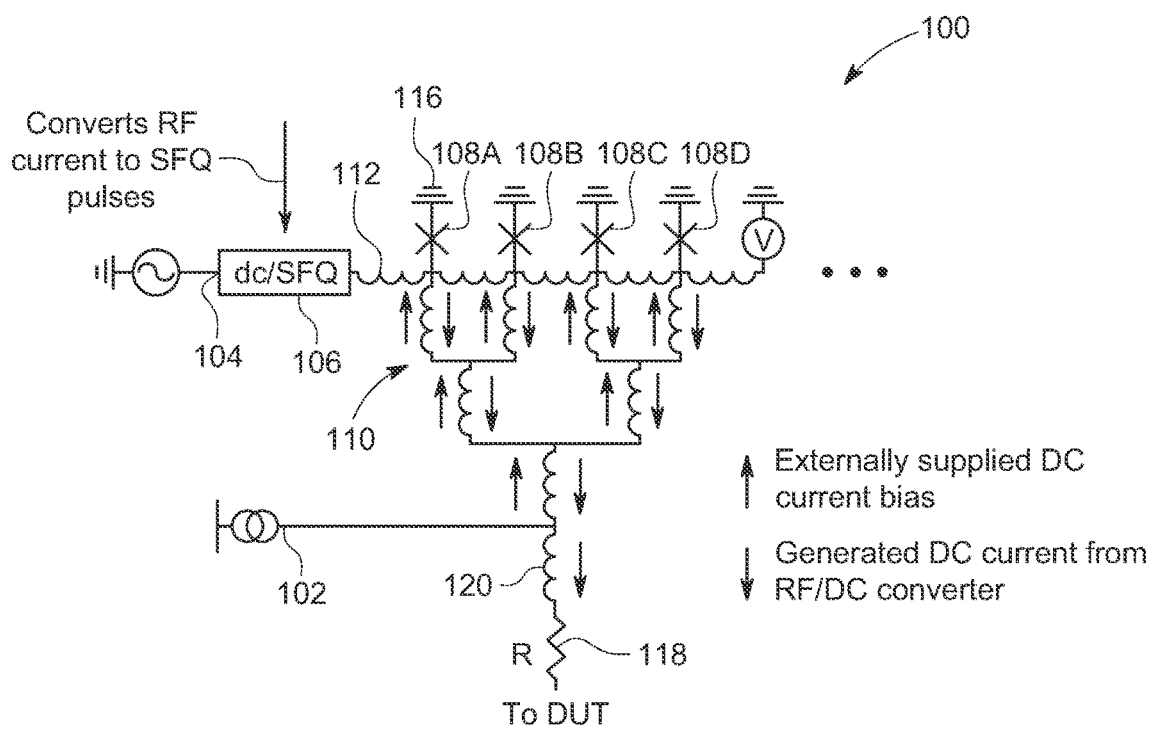
FIG. 1 is a schematic electronic circuit of a radio-frequency (RF) to direct current (DC) converter, according to an embodiment of the present invention.

FIG. 1 is a schematic electronic circuit of a radio-frequency (RF) to direct current (DC) converter, according to an embodiment of the present invention. The radiofrequency (RF) to direct current (DC) converter 100 includes a direct electrical current (DC) input port 102 and a radiofrequency (RF) input port 104. The converter 100 also includes a direct electrical current (DC) to single flux quantum (SFQ) (DC/SFQ) converter 106 connected to the RF input port 104. The DC to SFQ converter 106 is configured to convert RF current to SFQ current pulses. The radio-frequency (RF) to direct current (DC) converter 100 also includes a Josephson junction (JJ) 108A connected to both the DC input port 102 via a first induction line 110 and to the DC to SFQ converter 106 via a second induction line 112 and to ground 114. The converter 100 also includes a resistor 118 connected to the Josephson junction (JJ) 108A and to the DC input port 102 via a third induction line 120.

In operation, when a DC electrical current is applied via the DC input port 102, the DC electrical current is shunted to ground 116 through the JJ 108A and substantially no DC electrical current flows through the resistor 118, and when an RF electrical current is applied via the RF input port 104, output trains of SFQ current pulses from the DC to SFQ converter 106 with pulse-to-pulse spacing inversely proportional to the RF electrical current frequency cause the Josephson junction (JJ) 108A to switch at a rate commensurate with an RF frequency of the RF electrical current to generate a steady state voltage across the Josephson junction (JJ) 108A linearly dependent on the RF frequency such that an electrical current flowing through the resistor 118 is directly dependent on the RF frequency of the RF electrical current.

In an embodiment, the converter 100 further includes a plurality of Josephson junctions 108A, 108B, 108C, 108D connected to both the DC input port 102 via the first induction line 110 and to the RF input port 104 via the DC to SFQ converter 106 through the second induction line 112 and to ground 116. Although four Josephson junctions are depicted in FIG. 1, as it can be appreciated any number of Josephson junctions can be used, for example, two, three or more. The plurality of Josephson junctions 108A, 108B, 108C, 108D are configured to switch, when the RF electrical current is applied via the RF input port 104, at a rate commensurate the RF frequency of the RF electrical current to generate a steady state voltage across the plurality of Josephson junctions (JJ) 108A, 108B, 108C, 108D linearly dependent on the RF frequency such that the electrical current flowing through the resistor 118 is directly dependent on the RF frequency of the RF electrical current. It might be worth noting that the more JJs used in the FJTL, the greater the amount of current the FJTL can source was driven with RF.

As shown in FIG. 1, when a global bias current is applied at DC input port 102, the current is completely shunted to ground (up arrows) through the JJs 108A, 108B, 108C and 108D and no current flows (down arrows) through the resistive path (i.e., resistance 118) towards a device (DUT) (not shown). When an RF current is applied at the RF input port 104, the JJs 108A, 108B, 108C and 108D begin to switch at a rate commensurate with the frequency of the applied RF tone and develop a steady state voltage linearly dependent on the drive frequency. The FJTL develops a steady state DC voltage (V) across the Josephson junctions (JJ) 108A, 108B, 108C, 108D that is proportional to the RF frequency (f &) according to the following equation:

$$V = \Phi_0 \times f_{clk}$$

where $\Phi_0$ is a superconducting magnetic flux quantum.

This voltage then drives a current through the resistor 118 where the magnitude of the current is given by Ohm's law $I = V/R = \Phi_0 \times f_{clk}/R$. Thus, the last relation shows that this circuit is a true RF frequency to DC current converter where the linear scaling is set by the magnetic flux quantum and the shunt resistor.

Figure 2:
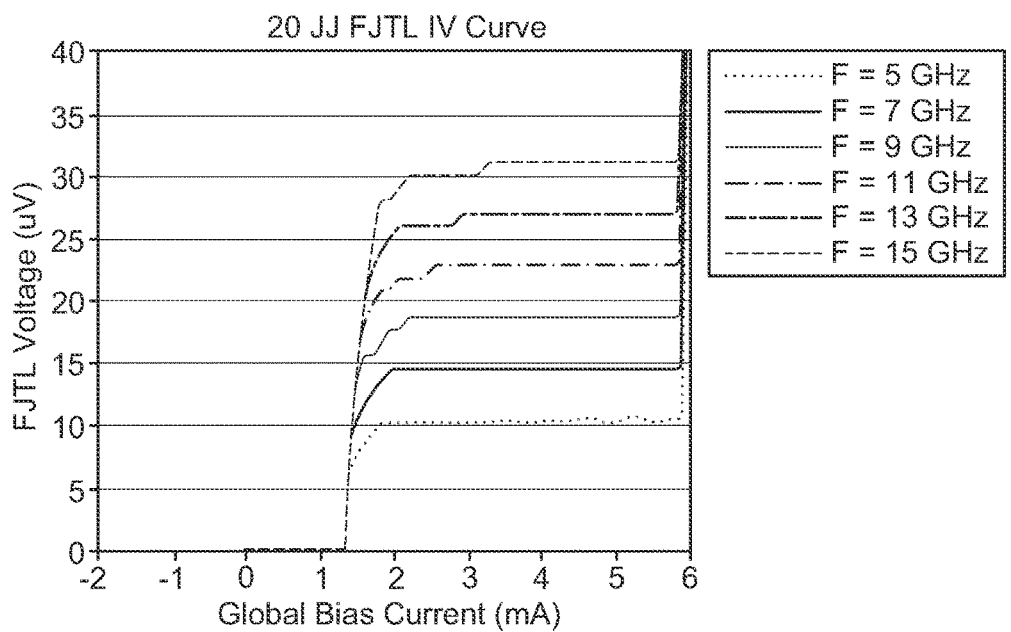
FIG. 2 is a plot of a resultant Current-Voltage for a simulation (for example, using WRSpice) of a 20 JJs (e.g., feeding Josephson transmission line—FJTL) for different drive frequencies (frequencies shown are 5 GHz, 7 GHz, 9 GHz, 11 GHz, 13 GHz, and 15 GHz), according to an embodiment of the present invention.

FIG. 2 is a plot of a resultant Current-Voltage for a simulation (for example, using WRSpice) of a 20 JJs (e.g., feeding Josephson transmission line— FJTL) for different drive frequencies (frequencies shown are 5 GHz, 7 GHz, 9 GHz, 11 GHz, 13 GHz, and 15 GHz), according to an embodiment of the present invention. In an embodiment, all the JJs had a critical current of 250 µA resulting in a total critical current of the circuit of 5 mA. FIG. 2 shows Shapiro steps begin at approximately 1.5 mA of applied DC bias to the FJTL for all frequencies applied. When globally biased at a current of about 3.5 mA, for example, the FJTL can source or sink up to about 1.5 mA of current and remain operational. The voltage developed across the FJTL is extremely stable for a large range of global bias current.

Figure 3:
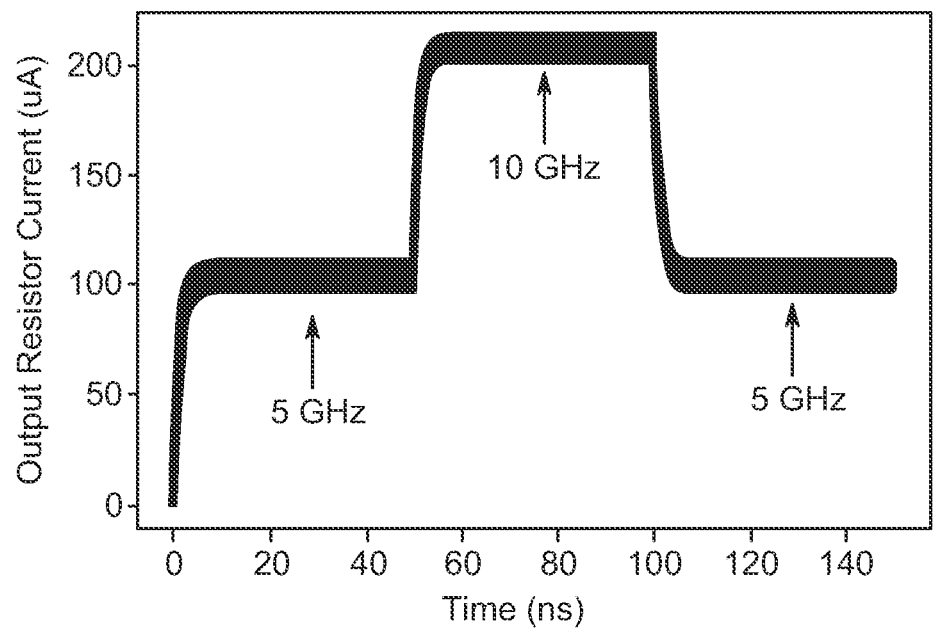
FIG. 3 is a plot of an output resistor current (in μA) versus time (in ns) obtained from a dynamic simulation (for example, using WRSpice) of current driven through a series combination of a 130 pH inductor and 0.1 resistor from a 20 JJ FJTL as a function of RF drive frequency, according to an embodiment of the present invention.

FIG. 3 is a plot of the output resistor current (in µA) versus time (in ns) obtained from a dynamic simulation (for example, using WRSpice) of current driven through a series combination of a 130 pH inductor and 0.1 resistor from a 20 JJ FJTL as a function of RF drive frequency, according to an embodiment of the present invention. WRSpice is a circuit simulation and analysis tool produced Whiteley Research Incorporated. At time t=0 ns, an RF current of 5 GHz is applied to a the dc/SFQ converter 106. The output pulses from the converter 106 are then fed into the FJTL having the 20 JJs. The FJTL develops a voltage (at 5 GHz, this voltage is approximately 10 µV) which then drives a 100 µA current through the resistor 118 with a characteristic time of t=L/R=1.3 ns. At time t=50 ns, the RF drive frequency input through RF input port 104 is changed to 10 GHz and the resulting current driven through the resistor 118 is doubled. Finally, at time t=100 ns, the RF drive frequency is set again to 5 GHz resulting in the current driven through the resistor 118 returning to the original 100 µA value.

Figure 4:
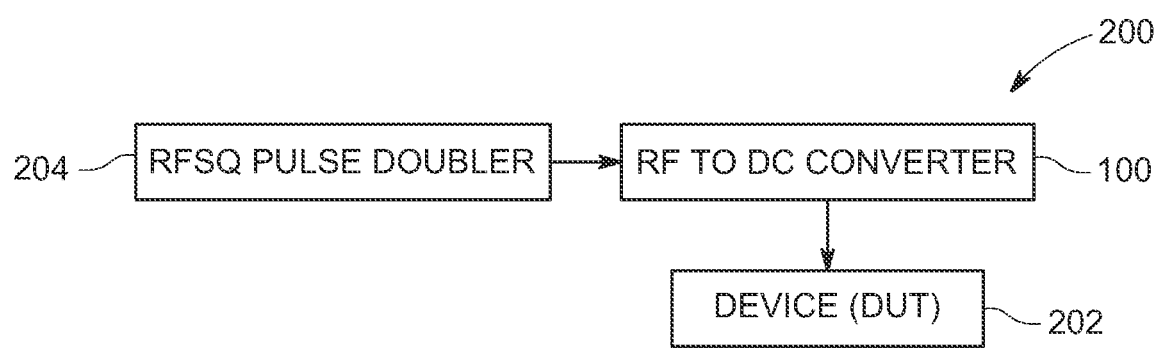
FIG. 4 is a block diagram of a quantum mechanical system including the RF to DC converter shown in FIG. 1, according to an embodiment of the present invention.

FIG. 4 is a block diagram of a quantum mechanical system 200 including the RF to DC converter 100, according to an embodiment of the present invention. The quantum mechanical system 200 includes the RF to DC converter 100 which may be provided with one or more Josephson junctions JJs 108A, 108B, 108C, 108D, for example. In an embodiment, the quantum mechanical system 200 also includes at least one quantum mechanical device 202 connected to the resistor 118 of the RF to DC converter 100. In an embodiment, the one or more devices 202 includes at least one of a qubit, a superconducting quantum interference device, or a non-quantum mechanical circuit such as, for example, a transistor or other circuit.

In an embodiment, it may be beneficial to be able to increase the operating voltage of the FJTL. In order to increase the operating voltage, the quantum mechanical system 200 may include one or more rapid single flux quantum (RSFQ) pulse doubler stages 204. The one or more RSFQ pulse doubler stages 204 can be provided prior to the RF to DC converter 100 so as to achieve a gain of $2^m$ increase in operating voltage, where m is the number of RSFQ pulse doubler stages.

Figure 5:
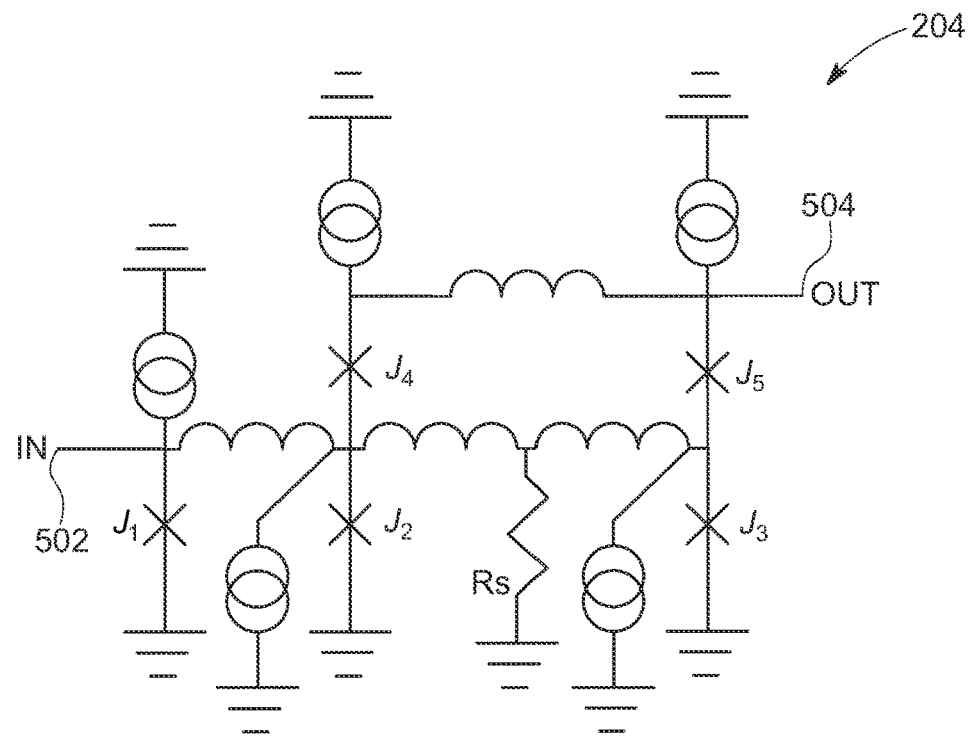
FIG. 5 is a schematic electronic circuit of an example conventional rapid single flux quantum (RSFQ) pulse doubler.

FIG. 5 is a schematic electronic circuit of an example conventional rapid single flux quantum (RSFQ) pulse doubler 204. The RSFQ pulse doubler 204 has an input port 502 and an output port 504. The output port 504 of the RSFQ pulse doubler 204 is connected to an input port 104 of the DC to SFQ converter 100. The RSFQ pulse doubler 204 is configured to generate single flux quantum (SFQ) pulse current input through the input port 104 of the DC to SFQ converter 106. However, other types of RSFQ pulse doublers can also be used.

Figure 6:
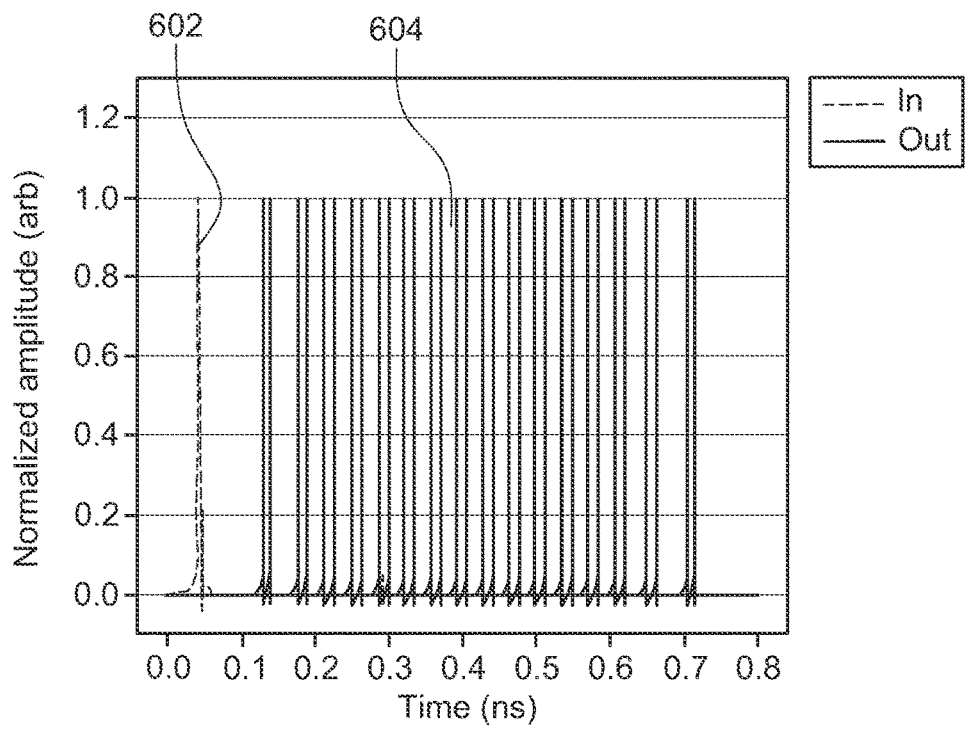
FIG. 6 is a plot of a single pulse input into a series array of five cascaded RSFQ pulse doublers and a plurality of pulses output by the RSFQ pulse doublers, according to an embodiment of the present invention.

FIG. 6 is a plot of a single pulse input into the RSFQ pulse doubler 204 and a plurality of pulses output by the RSFQ pulse doubler 204, according to an embodiment of the present invention. In an embodiment, the RSFQ pulse doubler 204 is configured to generate a plurality of current pulses 604 at double a rate of applied SFQ pulses at the output port of the RSFQ pulse doubler 204 from a single radiofrequency current pulse 602 input at the input port of RSFQ pulse doubler 204 so as to generate a larger voltage across the converter 100. In an embodiment, m stages of the rapid single flux quantum (RSFQ) pulse doubler 204 connected in series can be used. For example, FIG. 6 shows the result of a simulation (for example, using WRSpice) of the RSFQ pulse doubler 204 shown in FIG. 5 cascaded 5 times in series. The m stages of the RSFQ pulse doubler 204 can be configured to generate the RF electrical current (I) that is given by the following formula:

$$I=2^m \times \Phi_0 \times f_{c1k}/R$$

where $\Phi_0$ is a superconducting magnetic flux quantum, $f_{c1k}$ is the RF frequency of the RF electrical current, and R is a resistance value of the resistor.

In an embodiment, when an input pulse arrives at the input port 502, Josephson junctions J1 and J2 switch sequentially. The SFQ pulse from J2 splits between the upper path formed from Josephson junctions J4 and J5 and the lower branch formed from Josephson junctions J2 and J3. The shunt resistor Rs in the lower branch sets an L/R rise time of the current in the lower branch delaying any switching action in Josephson junction J3. The upper branch pulse switches Josephson junction J5 which delivers a pulse to the output port 504 while also driving current into Josephson junctions J3 and J4. This additional current along with that from the delayed current from the switching of Josephson junction J2 forces Josephson junction J3 to switch and produce a second pulse at the output. Josephson junction J4 acts as a protection junction preventing Josephson junction J2 from switching twice. For m stages placed in series, the resulting current driven by the RF to DC converter 100 is then $I=2^m \times \Phi_0 \times f_{c1k}/R$. This circuit and it's operation is from pre-existing literature. Does that matter?

Figure 7:
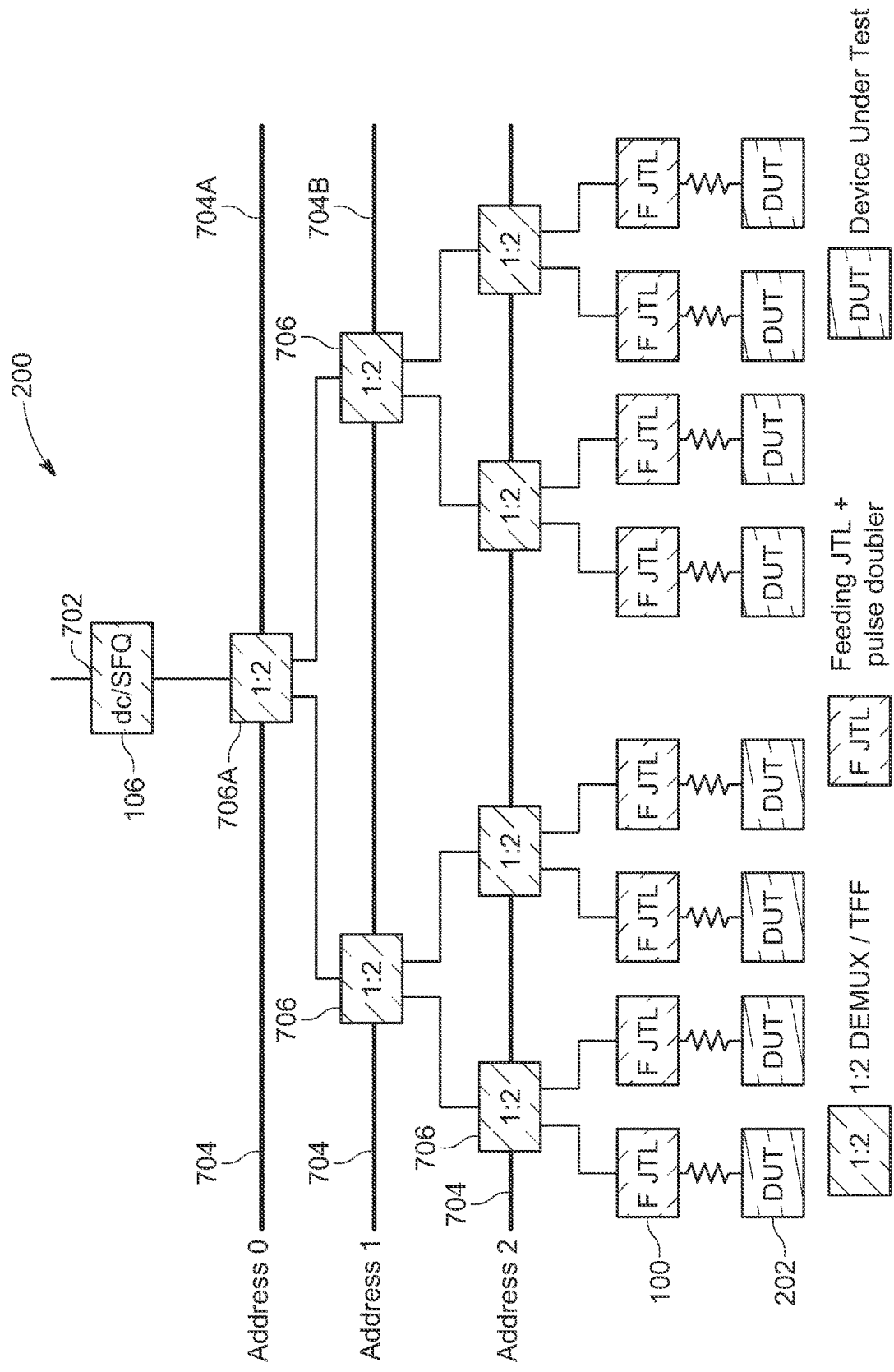
FIG. 7 is schematic diagram depicting how a single DC/SFQ converter 106 can provide controllably fast flux bias to a plurality of devices (DUTs) via a plurality of RF to DC converters, according to an embodiment of the present invention.

FIG. 7 is schematic diagram depicting how a single dc/SFQ converter 106 can provide controllably fast flux bias to a plurality of devices (DUTs) via a plurality of RF to DC converters, according to an embodiment of the present invention. In an embodiment, the quantum mechanical system 200 includes a plurality of radio-frequency (RF) to direct current (DC) converters 100. The quantum mechanical system 200 also includes a plurality of devices DUTs (e.g., quantum mechanical devices) 202. Each of the plurality of quantum mechanical devices 202 is connected to a corresponding one of the plurality of RF to DC converters 100. The plurality of RF to DC converters 100 are addressable so that SFQ pulses produced from the RF electrical current by the dc to SFQ converter 106 are routed to a desired converter in the plurality of RF to DC converters (FJTLs) 100.

In an embodiment, the quantum mechanical system 200 further includes an input port 702 configured to receive the direct electrical current (DC) and the radiofrequency (RF) electrical current; and a plurality of address lines 704, each address line 704 having at least one demultiplexer (DE-MUX) 706. A demultiplexer (DEMUX) 706A in a first address line 704A is connected to the input port 702 via the DC/SFQ converter 106. Each 100 converter in the plurality of radio-frequency (RF) to direct current (DC) converters (FJTLs) 100 is connected to a corresponding one of the least one demultiplexer (DEMUX) 706.

In an embodiment, the demultiplexer (DEMUX) 706A in the first address line 704A is connected to two demultiplexers (DEMUX) 706 in a second address line 704B and each of the two demultiplexers 706 is connected to at least two radio-frequency (RF) to direct current (DC) converters (FJTLs) 100.

Therefore, in an embodiment, a series combination of multistage RSFQ pulse multipliers 204 and resistively shunted FJTL 100 can be placed at an end of a RSFQ DEMUX tree such that a single dc/SFQ converter source 106 can drive a multitude of devices (DUTs) 202. As shown in FIG. 7, a single DC/SFQ converter 106 drives the input of a flux biased 1:2 DEMUX 706. Depending on the sign of the current in the respective address line 704, the flux pulse from the DC/SFQ converter 106 is routed either to the left or the right of the 1:2 DEMUX 704.

Figure 8:
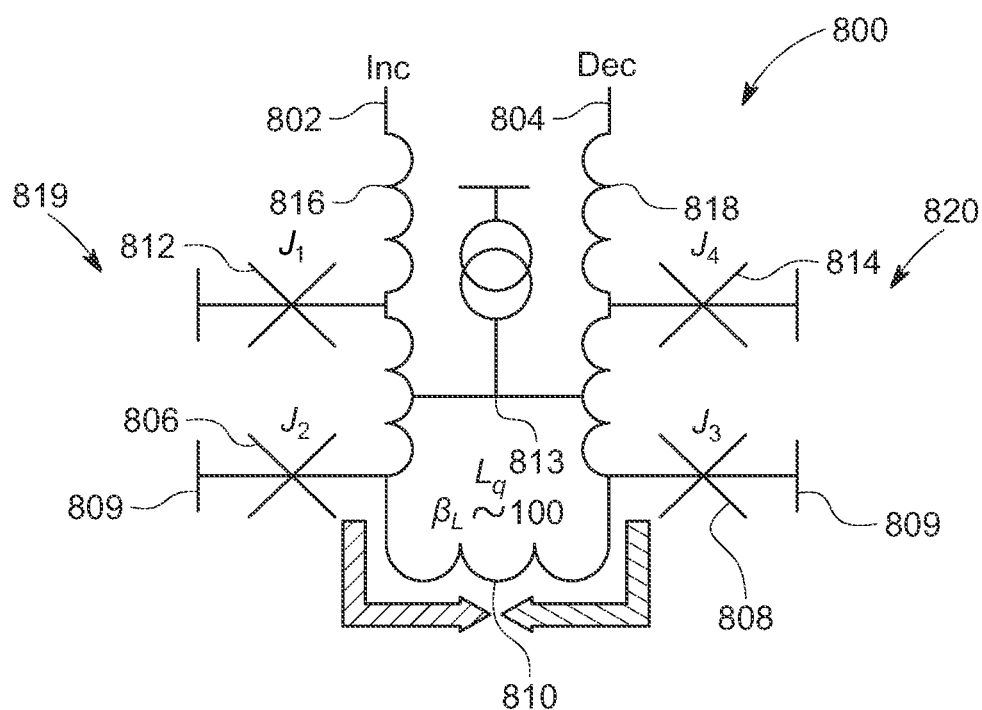
FIG. 8 is a schematic electronic circuit of a bipolar quantized supercurrent generator (QSG), according to an embodiment of the present invention.

FIG. 8 is a schematic electronic circuit of a bipolar quantized supercurrent generator (QSG) 800, according to an embodiment of the present invention. The bipolar quantized supercurrent generator (QSG) 800 includes a first input port 802 configured to receive at least one increment single flux quantum pulses and a second input port 804 configured to receive at least one decrement single flux quantum pulses. The QSG 800 further includes a first Josephson junction (JJ) 806 connected to the first input port 802 and a second Josephson junction (JJ) 808 connected to the second input port 804. The first and second Josephson junctions 806, 808 are further connected to ground 809. The QSG 800 also includes an inductor ($L_q$) 810 connected to the first Josephson junction 806 and to the second Josephson junction 808. The inductor ($L_q$) 810 and the first and second Josephson junctions (JJs) 806 and 808 form a superconducting quantum interference device (SQUID) loop. In operation, an electrical current circulating in the storage SQUID loop formed by the first Josephson junction 806, the second Josephson junction 808 and the inductor ($L_q$) 810 increases or decreases in increments based on the at least one increment single flux quantum pulses input through the first input port 802 or the at least one decrement single flux quantum pulses input through the second input port 804, respectively.

In an embodiment, the electrical current circulating in the storage SQUID loop increases or decreases by electrical current increments $\Delta I$ given by the following equation:

$$\Delta I = \Phi_0 / L_q$$

where $\Phi_0$ is a superconducting magnetic flux quantum and $L_q$ is an inductance value of the inductor ($L_q$).

In an embodiment, the QSG 800 also includes a third input port 813 connected to the first Josephson junction (JJ) 806, the second Josephson junction (JJ) 808 and the inductor (Lq) 810. The third input port 813 is configured to input a bias direct electrical current (DC) to the storage loop to electrically bias the first and second Josephson junctions 806 and 808 so that the first and second Josephson junctions 806 and 808 produce pulses when pulses are applied to their respective inputs.

In an embodiment, a screening parameter $\beta_L$ of the SQUID loop is dependent on a critical electrical current I of the first and second Josephson junctions 806 and 808 in the SQUID loop and the inductance value of the inductor connecting the first and second Josephson junctions.

In an embodiment, QSG 800 further includes a third Josephson junction (JJ) 812 connected to the first Josephson junction (JJ) 806 and the first input port 802 via a first induction line 816. QSG 800 also includes a fourth Josephson junction (JJ) 814 connected to the second Josephson junction (JJ) 808 and the second input port 804 via a second induction line 818. The first Josephson junction (JJ) 806 and the third Josephson junction (JJ) 812 form a first Josephson transmission line (JTL) 819 and the second Josephson junction (JJ) 808 and the fourth Josephson junction (JJ) 814 form a second Josephson transmission line (JTL) 820.

In an embodiment, when an SFQ pulse arrives at the first input port "Inc" 802, it triggers junctions J1 812 and J2 806 to switch, setting up a circulating current flowing from J2 812 through Lq 810 (left-to-right arrow). The user can unset this circulating current by triggering junctions J3 808 and J4 814 from the second input port "Dec" 804 to circulate current flowing from J3 808 through Lq 810 (right-to-left arrow), resetting the device. Because the induction value $L_q$ (and hence $\beta_1$) are so large, the circulating current is not large enough to over or under bias either junctions J3 808 or J2 806, allowing multiple pulses to be applied consecutively from either the first input port "Inc" 802 or the second input port "Dec" 804. SFQ pulses loaded from the first input port 802 or the second input port 804 increase or decrease, respectively, the current in the storage loop formed by $L_q$ and junctions J2 806 and J3 808 in increments of $\Delta I = \Phi_0/L_q$. In an embodiment, $\beta_L$ is equal to approximately 100.

Therefore, the storage inductor $L_q$ in combination with the last stage JJs (in this case J2 806 and J3 808) of the first Josephson transmission line (JTL) 819 and the second Josephson transmission line (JTL) 820, respectively, forms a superconducting quantum interference device (SQUID) with a $\beta_L$ for example equal to about 100. This allows for the storage of a multitude of magnetic flux quanta that can be loaded from either JTL (the first JTL 819 or the second JTL 820) resulting in precise increments or decrements of current in $L_q$ with step size $\Delta I = \Phi_0/L_q$. Once the appropriate amount of current is loaded into $L_q$ as determined by the user, the circuit can be powered down with the flux perpetually stored in the loop. In an embodiment, QSG 800 can support 100-1000's of flux quanta worth of circulating current depending on the value of $L_q$, thus allowing for precise steps in flux bias on the order of 0.01-0.001 $\Phi_0$.

Figure 9A:
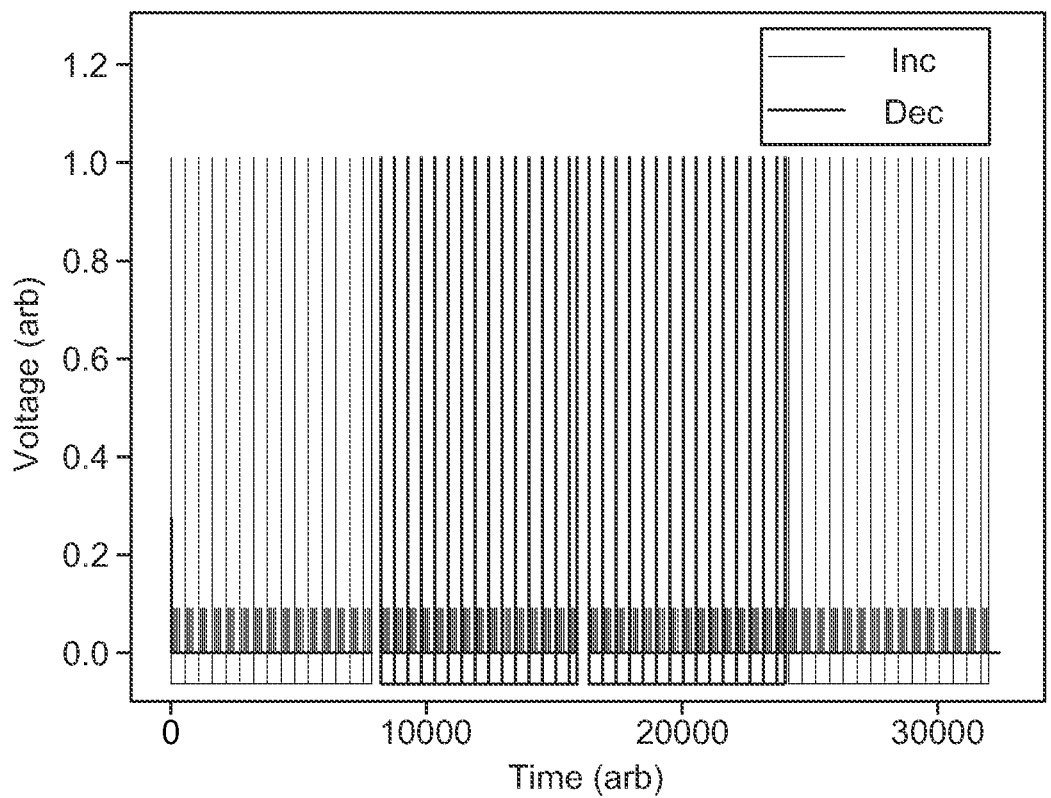
FIGS. 9A-9D show dynamic simulations of the bipolar quantized supercurrent generator (QSG) shown in FIG. 8, according to an embodiment of the present invention.
Figure 9B:
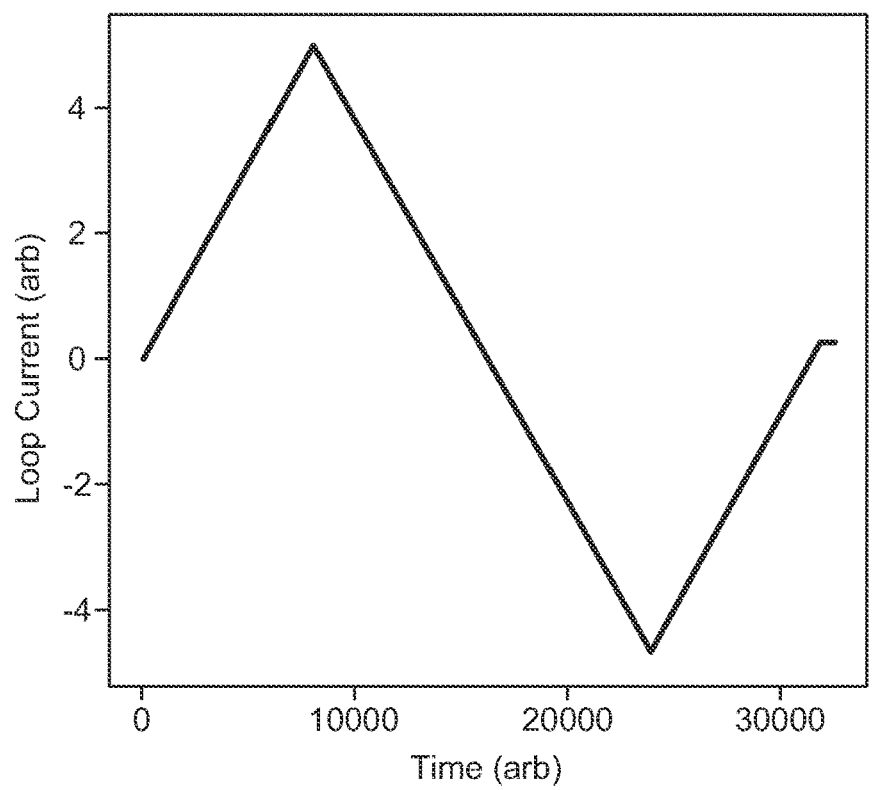
Figure 9C:
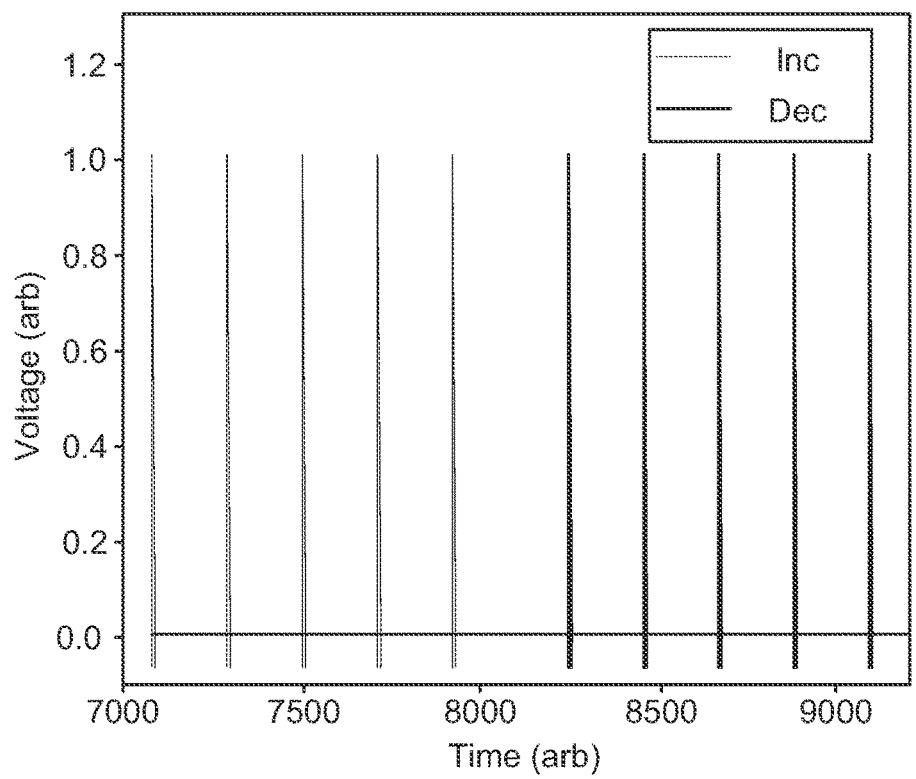
Figure 9D:
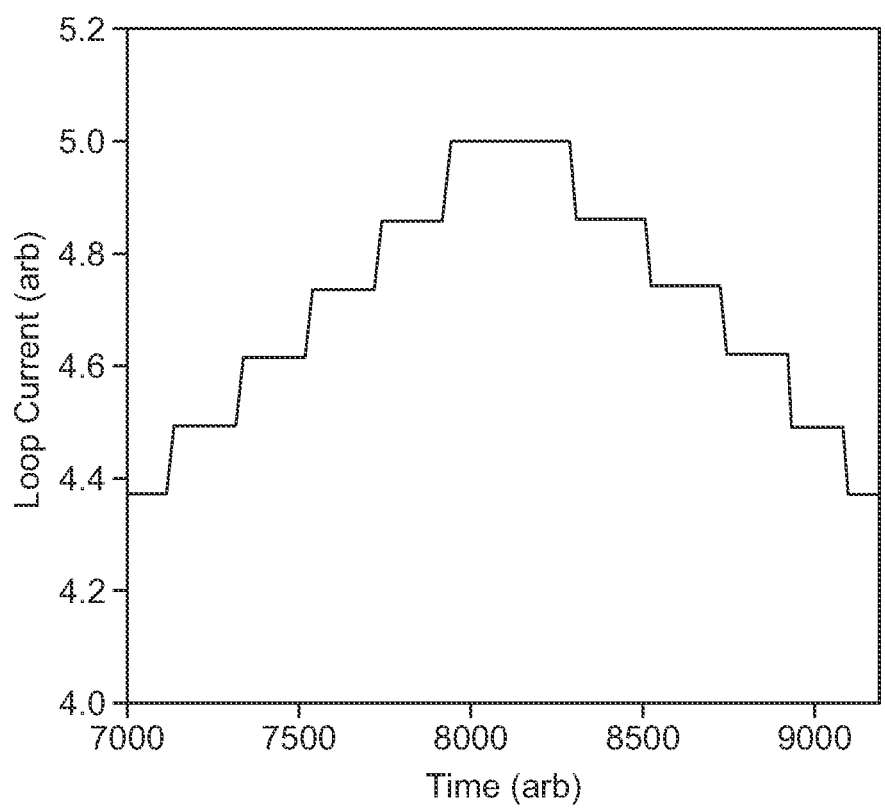

FIGS. 9A-9D show dynamic simulations of the bipolar quantized supercurrent generator (QSG) 800, shown in FIG. 8, according to an embodiment of the present invention. As pulses, shown in FIG. 9A, are loaded from the second input port "Dec" 804 input the current $I(L_q)$ in $L_q$ is lowered in quantized amounts $\Phi_0/L_q$, as shown in FIG. 9B. As pulses, shown in FIG. 9C, are loaded into the first input port "Inc" 802, the current is increased in the same quantized amount per flux pulse, as shown in FIG. 9D (ascending steps from left-to-right). SFQ pulses applied to the first input port "Inc" 802 increase the stored current in the loop in quantized amounts. The transition from one step to a next step occurs upon application of a pulse. SFQ pulses, shown in FIG. 9C, applied to the second input port 804 lower the current stored in the quantizing inductance $L_q$ in quantized amounts (descending steps from left-to-right), as shown in FIG. 9D.

Figure 10:
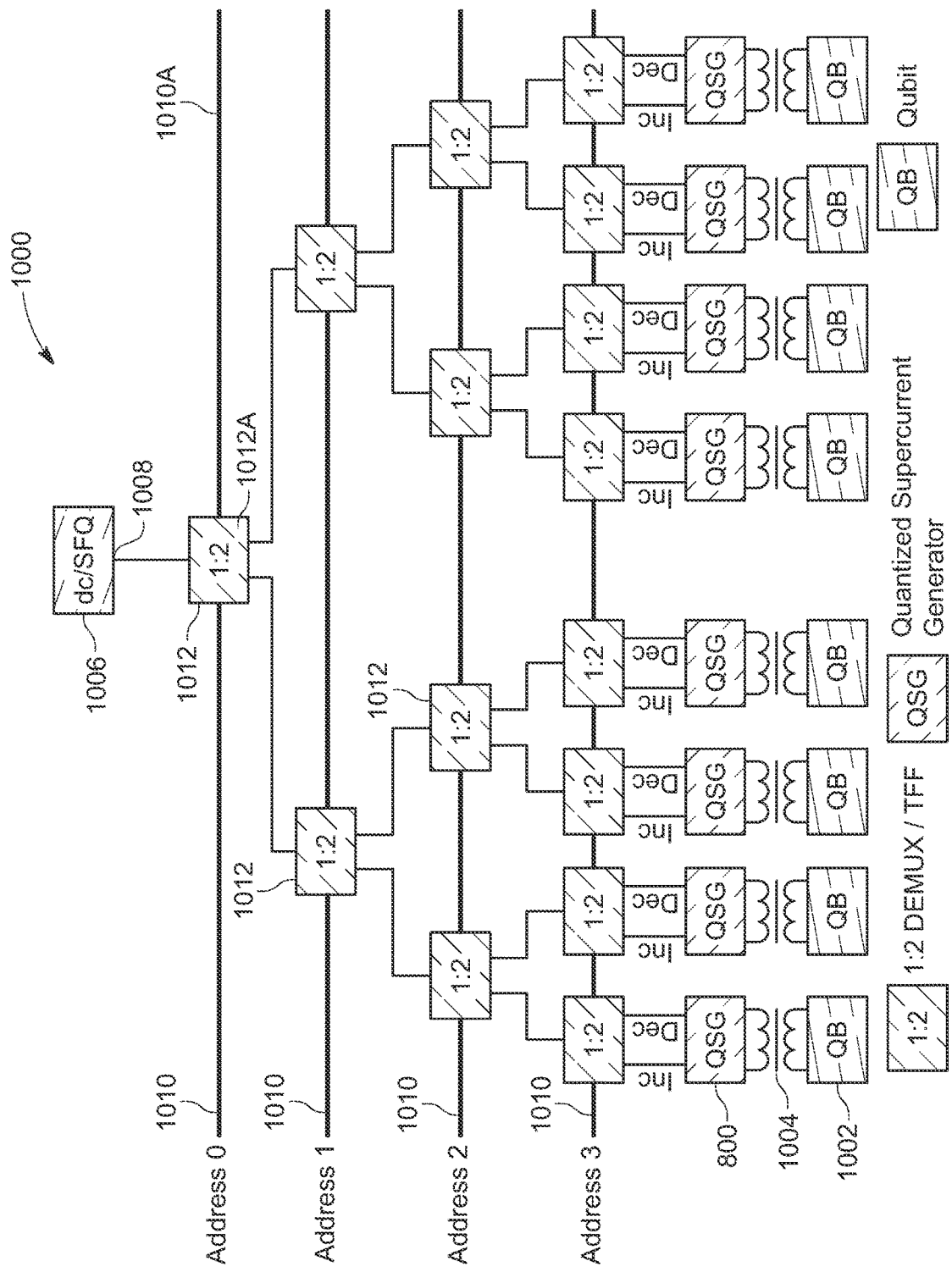
FIG. 10 is a schematic diagram of a quantum mechanical system using the QSG shown in FIG. 8, according to an embodiment of the present invention.

FIG. 10 is a schematic diagram of a quantum mechanical system 1000 using the QSG 800 shown in FIG. 8, according to an embodiment of the present invention. The quantum mechanical system 1000 includes the bipolar quantized supercurrent generator (QSG) 800. In an embodiment, the quantum mechanical system includes a plurality of QSGs 800. In an embodiment, the quantum mechanical system further includes a plurality of quantum mechanical devices 1002. Each of the plurality of quantum mechanical devices 1002 is inductively coupled, for example via inductance 1004, to a corresponding one of the plurality of QSGs 800. The plurality of QSGs 800 are addressable so that input SFQ pulses, from DC/SFQ converter 1006, are routed to a desired QSG in the plurality of QSGs 800.

In an embodiment, the quantum mechanical system 1000 further includes an input port 1008 configured to receive a direct electrical current (DC) and a single flux quantum (SFQ) radiofrequency current. The quantum mechanical system 1000 further includes a plurality of address lines 1010. Each address line 1010 has at least one demultiplexer (DEMUX) 1012. A demultiplexer (DEMUX) 1012A in a first address line 1010A is connected to the input port 1008. Each QSG 800 is connected to a corresponding one of the least one demultiplexer (DEMUX) 1012.

In an embodiment, a single DC/SFQ converter 1006 can provide bi-polar flux bias to numerous different qubits 1002. The polarity of the current on the address lines 1010 determines whether the SFQ pulse, from the DC/SFQ converter 1006, is routed to the left or right output of the 1:2 DEMUX 1012. At the final stage, the polarity of the current on the address line determines whether the pulse is delivered to the first input port "Inc" 802 or the second input port "Dec" 804 of the corresponding QSG 800. When the QSG 800 is coupled to the SQUID loop of a superconducting qubit (QB) 1002, this can provide both positive and negative flux bias. The scaling in the number of devices (e.g., qubits) that are able to be biased in such an architecture with the number of address lines is $2^{(n-1)}$, where n is the number of address lines.

One benefit of using the present QSG 800 is to provide the ability to generate bi-polar persistent current with zero quiescent power dissipation. This opens the door to efficiently flux bias circuits inside cryostats at any temperature stage. In addition, when combined with the added benefit of DEMUXing control signals, the QSGs together with the DEMUX configuration shown in FIG. 10 provides a scalable path to DC flux biasing quantum processors with 1000's of devices (e.g., qubits) with an exponential decrease in the used number of control lines from room temperature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

I claim:

1. A radio-frequency (RF) to direct current (DC) converter comprising:
 a Josephson junction (JJ);
 a direct electrical current (DC) to single flux quantum (SFQ) converter connected to the JJ, wherein the DC to SFQ converter provides for switching action of the JJ by transmitting SFQ pulses to the JJ; and
 a rapid single flux quantum (RSFQ) pulse doubler that is connected to the DC to SFQ converter and that generates SFQ pulse current to the DC to SFQ converter for affecting the JJ,
 wherein the DC to SFQ converter converts radio frequency (RF) current from an external RF source into at least a portion of the SFQ pulses, and wherein the JJ is caused to switch at a rate commensurate with an RF frequency of the RF current to generate a steady state voltage across the JJ that is linearly dependent on the RF frequency.

2. The RF to DC converter according to claim 1, wherein the DC to SFQ converter transmits the SFQ pulses having been, at least in part, generated by the DC to SFQ converter by converting the RF current, and having been, at least in part, received from the RSFQ pulse doubler.

3. The RF to DC converter according to claim 1, further comprising:
a resistor connected to the JJ and connectable to an external device, wherein an electrical current flow through the resistor to the external device comprises an RF frequency directly dependent on an RF frequency of the RF current applied from an external RF source to the DC to SFQ converter.

4. The RF to DC converter according to claim 3, wherein the JJ is configured to direct DC current from an external DC source to ground rather than to the resistor.

5. The RF to DC converter according to claim 1, further comprising:
a plurality of additional JJ's connected to the DC to SFQ converter and configured to switch in response to the SFQ pulses from the DC to SFQ converter.

6. The RF to DC converter according to claim 1, wherein a steady state voltage (V) across the JJ is proportional to the RF frequency (fc1k) according to the following equation:

$$V = Po \times fc1k$$

where Po is a superconducting magnetic flux quantum.

7. A quantum mechanical system comprising:
a radio-frequency (RF) to direct current (DC) converter comprising:
a Josephson junction (JJ),
a direct electrical current (DC) to single flux quantum (SFQ) converter connected to the JJ, wherein the DC to SFQ converter provides for switching action of the JJ by transmitting SFQ pulses to the JJ,
a rapid single flux quantum (RSFQ) pulse doubler that is connected to the DC to SFQ converter and that generates SFQ pulse current to the DC to SFQ converter for affecting the JJ,
a resistance element connected to the JJ; and
a quantum mechanical device connected to the resistor, wherein an RF current passing through the resistor is directed to the quantum mechanical device, and
wherein the DC to SFQ converter converts radio frequency (RF) current from an external RF source into at least a portion of the SFQ pulses, and wherein the JJ is caused to switch at a rate commensurate with an RF frequency of the RF current to generate a steady state voltage across the JJ that is linearly dependent on the RF frequency.

8. The quantum mechanical system according to claim 7, wherein the quantum mechanical device comprises at least one of a qubit, a superconducting quantum interference device, or a nonquantum mechanical circuit.

9. The quantum mechanical system according to claim 7, wherein the DC to SFQ converter transmits the SFQ pulses having been, at least in part, generated by the DC to SFQ converter by converting the RF current, and having been, at least in part, received from the RSFQ pulse doubler.

10. The quantum mechanical system according to claim 7, further comprising:
m stages of the rapid single flux quantum (RSFQ) pulse doubler connected in series,
wherein the m stages of the RSFQ pulse doubler are configured to generate an RF electrical current (I) that is given by the following formula:

$$I = 2^m \times Po \times fc1k/R$$

where Po is a superconducting magnetic flux quantum, fc1k is the RF frequency of the RF electrical current, and R is a resistance value of the resistor.

11. The quantum mechanical system according to claim 7, further comprising:
a plurality of additional ones of the RF to DC converter; and
a plurality of additional quantum mechanical devices,
wherein each quantum mechanical device of the plurality of quantum mechanical devices is connected to a corresponding RF to DC converter of the plurality of additional ones of the RF to DC converter,
wherein the plurality of RF to DC converters are addressable so that the SFQ pulses are routed to a selected RF to DC converter of the RF to DC converter and the plurality of additional ones of the RF to DC converter.

12. The quantum mechanical system according to claim 11, further comprising:
an input port configured to receive an input direct current (DC) and an input radio frequency (RF) current; and
an address line having a demultiplexer (DEMUX) connected to the input port and to the DC to SFQ converter.

13. A bipolar quantized supercurrent generator (QSG) comprising:
a superconducting quantum interference device (SQUID) loop comprising a first Josephson junction, a second Josephson junction and an inductor (Lq) that is connected to the first Josephson junction and to the second Josephson junction,
wherein an electrical current circulating at the SQUID loop increases in electrical current increments based on at least one of an increment of single flux quantum pulses received at the first Josephson junction or decreases in electrical current decrements based on at least one decrement of single flux quantum pulses received at the second Josephson junction.

14. The bipolar QSG according to claim 13, wherein the electrical current increases or decreases by electrical current increments AI given by the following equation:

$$\Delta I = Po/Lq$$

where Po is a superconducting magnetic flux quantum and Lq is an inductance value of the inductor (Lq).

15. The bipolar QSG according to claim 13, wherein the first Josephson junction and the second Josephson junction are configured to produce pulses due to biasing of the first Josephson junction and the second Josephson junction by a bias direct electrical current (DC) input to the SQUID loop.

16. The bipolar QSG according to claim 13, wherein a screening parameter BL of the SQUID loop is dependent on a critical electrical current I of the first and second Josephson junctions in the SQUID loop and on the inductance value of the inductor connecting the first and second Josephson junctions.

17. The bipolar QSG according to claim 13, further comprising:
an input port configured to receive a direct electrical current (DC) and a single flux quantum (SFQ) radiofrequency current; and
an address line having a demultiplexer (DEMUX) connected to the input port and to the QSG.

18. The quantum mechanical system according to claim 7, wherein the JJ is configured to direct DC current from an external DC source to ground rather than to the resistor.

19. The quantum mechanical system according to claim 18, further comprising:
   a plurality of additional JJ's connected to the DC to SFQ converter and configured to switch in response to the SFQ pulses from the DC to SFQ converter.

20. The quantum mechanical system according to claim 7, wherein a steady state voltage (V) across the JJ is proportional to the RF frequency (fc1k) according to the following equation:

$$V = P_o \times fc1k$$

where Po is a superconducting magnetic flux quantum.

* * * * *